PULSE WIDTH TO ANALOG SIGNAL CONVERTER

Filed April 12, 1967

INVENTOR
H. R. BEURRIER

United States Patent Office 3,506,848

Patented Apr. 14, 1970

3,506,848

PULSE WIDTH TO ANALOG SIGNAL CONVERTER

Henry Richard Beurrier, Chester Township, Morris County, N.J., asssignor of ten percent to Sylvan Sherman, Union County, and fifteen percent to Richard O. Winter, Morris County, N.J.

Filed Apr. 12, 1967, Ser. No. 630,310
Int. Cl. H03k *5/20, 5/18*
U.S. Cl. 307—234 6 Claims

ABSTRACT OF THE DISCLOSURE

A circuit for converting pulse width encoded signals into analog form which, in the absense of input signals, will provide an output signal within prescribed limits. Such a circuit is useful, for example, in remote control applications to provide a "fail safe" operation.

BACKGROUND OF THE INVENTION

This invention relates to signal translating circuits within this field to circuits for converting pulse width encoded signals into analog form.

Arrangements known in the art, including both alternating and direct current coupled circuits, provide analog output signals which are related directly to the pulse width of input signals. Such circuits are useful in the control of various mechanical devices such as, for example, the control surfaces of model airplanes. In such applications it is essential that the analog output signal be held within fixed limits to prevent a crash in the event that the input signal is not received. In general, prior art circuits employed for this purpose require an input signal monitoring circuit which provides a predetermined voltage to maintain the control surfaces in a nominal or neutral position in the absence of the input signal.

SUMMARY OF THE INVENTION

A direct current (or voltage) coupled pulse width to analog converter is provided which will revert to a preset output voltage upon termination or loss of the input control signal. This "fail safe" condition is achieved without recourse to the prior art monitoring circuits.

The converter consists of a capacitor charging circuit, a transistor switch to enable the charging circuit or to discharge the capacitor, depending upon the presence or absence of an input signal, and a peak voltage detector connected to the capacitor. The output of the peak voltage detector is filtered to provide an analog output. The pulse width encoded signal input is capacitor coupled to the transistor switch. The bias circuit for the transistor switch may be set such that, in the absence of input pulses, the output of the switch transistor will be at a level that will provide a voltage for the peak voltage detector which will result in the desired fail safe output signal.

The preset fail safe output is inherently temperature stable, and it remains a fixed proportion of the supply voltage, making it in many systems, insensitive to supply voltage variations. Also the interaction between the fail safe output determining components and those components governing pulse width to analog conversion is held to a low level. In addition the circuit controls the analog output signal excursion with a given pulse width time excursion. It is also insensitive to duty cycle variations of the pulse width modulated input control signal.

Figure 1:
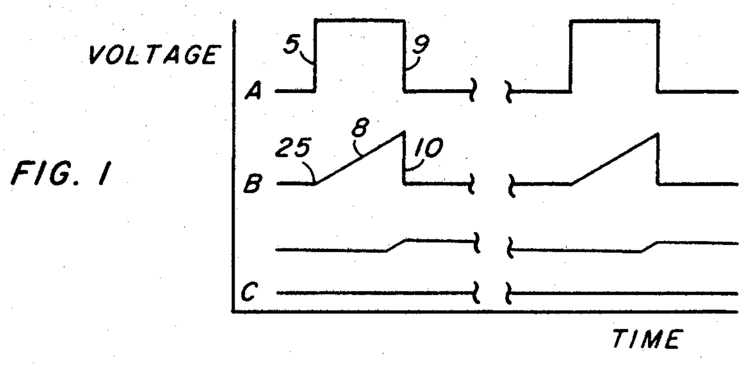
Figure 2:
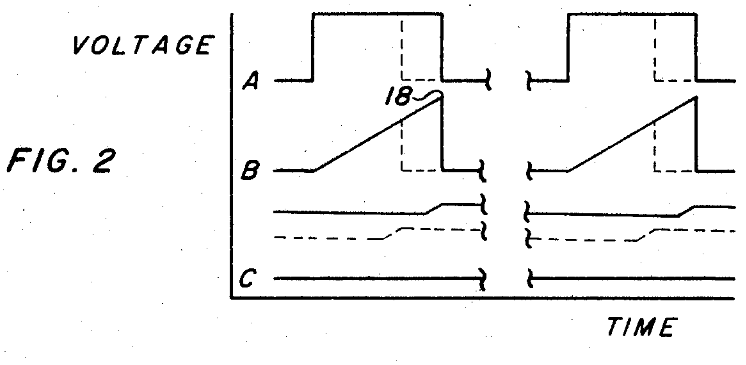

A complete understanding of this invention and of these and various other features may be gained from the following detailed description and the accompanying drawing in which:

FIGURES 1 and 2 graphically depict two conditions of the input pulse width modulated control signal. FIGURE 1 represents a median pulse width input signal while FIGURE 2 represents a wider or longer pulse width signal.

Figure 3:
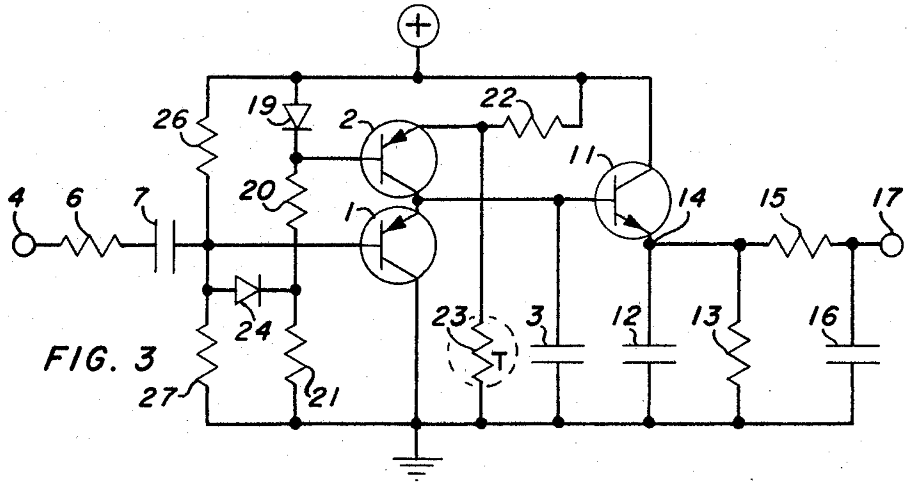

FIGURE 3 is a schematic representation of the pulse width to analog converting circuit.

Transistors 1 and 2, and capacitor 3, FIGURE 3, form a sawtooth generator. Transistor 1 acts as a switch under the normal input signal condition, while transistor 2 acts as a constant current source for the purpose of charging capacitor 3. The charging cycle of capacitor 3 begins when the pulse width modulated input control signal is applied at point 4 FIGURE 3 and, as shown by point 5 in FIGURE 1A, is coupled through resistor 6 and capacitor 7. It drives the base of transistor 1 positive which renders it non-conducting or "open." The voltage across capacitor 3 increases, as shown by curve 8 in FIGURE 1B, until the input control signal, as shown by curve 9 in FIGURE 1A, drives the base negative, thus causing transistor 1 to conduct or "close." Capacitor 3 then partially discharges through transistor 1, as shown by point 10 in FIGURE 1B.

The sawtooth voltage thus generated is connected to the base of the peak voltage detector, transistor 11. Whenever the voltage between the base and the emitter of transistor 11 is positive enough to cause transistor 11 to conduct, the emitter-follower gain of the transistor provides a charging current for capacitor 12. When the base voltage is too negative to charge capacitor 12, the transistor 11 is non-conducting, leaving capacitor 12 to slowly discharge through a relatively high resistance afforded by resistor 13. The signal at point 14 in FIGURE 3 is at the level shown in FIGURE 1C. This peak voltage detector acts much the same as a diode detector, except that it has power gain. Resistor 15 and capacitor 16 act as a filter to smooth out the detected voltage and to limit response time of the pulse width to analog converter. The output of the converter is at point 17 in FIGURE 3.

When the pulse width of the input control signal is increased, as shown in FIGURE 2A, it may be seen that the voltage across capacitor 3 is permitted to reach a higher value as shown by point 18 in FIGURE 2B, and results in a correspondingly higher detected peak voltage, as shown in FIGURE 2C.

Transistor 2 is biased by diode 19 which is forward biased by current drawn through resistors 20 and 21. Although a resistor could be used in place of diode 19, the diode provides a lower impedance bias voltage for the base of the constant current generator, transistor 2, than would a resistor, for a given amount of bias current.

The magnitude of the constant current generated is primarily governed by the resistor 22 and the forward current gain of transistor 2, and is modified by thermistor network 23 to permit temperature compensation of the pulse width to analog conversion.

Diode 24, biased by resistors 20 and 21, clamps the pulse width modulated input control signal so that transistor 1 is driven slightly negative to ensure that the starting point, point 25 in FIGURE 1B, remains fixed. Resistor 6 in the input circuit reduces loading on the input signal source and increases the length of time capacitor 7 can supply current to the clamp diode 24 when the input is positive and to the base of transistor 1 when the input is negative.

In the absence of an input pulse-width modulated control signal, transistor 1 is no longer being switched "closed" and "open," and the base of transistor 1 settles to a bias voltage determined by the relative values of resistors 26 and 27. The voltage at the junction of resistors 26 and 27 is carried through the now static converter circuit by transistors 1 and 11 which are operating as a cascaded pair of emitter followers. The base to emitter voltage of transistor 1 is cancelled by an approximately equal and opposite base to emitter voltage of transistor 11. Also any temperature induced change in these offset voltages will likewise cancel, if the transistors are properly chosen, and provide a very stable, fail safe, output voltage at point 17, FIGURE 3.

The impedance of the above mentioned network, while low enough to provide a stable bias under the fail safe condition, is made high enough so that the capacity coupled pulse width encoded input signal is capable of overriding the network and properly switching transistor 1.

In this fashion the circuit of the invention achieves the conversion of pulse width to analog, and under a no input signal condition, it inherently reverts to a preset fail safe output, without recourse to auxiliary means.

Since the pulse width modulated control signal is capacitor coupled, through capacitor 7, the control signal may assume any fixed voltage while in the fail safe condition. If the input, at 4 is always negative (or positive) in the absence of an input control signal, a diode may be substituted for capacitor 7, with the diode connected so that it is nonconducting under the fail safe condition. This permits the resistor network 26 and 27 to determine the fail safe output at 17, as before, and to switch transistor 1, as required, when the control signal is present.

With the minimum, median and maximum pulse widths of the input control signal, and the fail safe voltage fixed by a given design, the output voltage range may be controlled by changing the voltage point from which the voltage charge ramp of capacitor 3 starts, and to which it returns, when transistor 1 is switched "closed." This point is controlled by returning the collector of transistor 1 to a voltage point other than ground. An example of this would be to add a forward biased diode, resistor, or breakdown (Zener) diode between ground and the bleeder network composed of diode 19 and resistors 20 and 21.

If the collector is then connected to the more positive voltage point at the junction of resistor 21 and the newly added resistor or diode, the starting point of capacitor 3 charge will be higher and by operating with a reduced charging current, the circuit will produce a correspondingly reduced output voltage swing.

Since the converter circuit utilizes a peak voltage detector which "fills in" the voltage between the peaks rather than an integration of the width modulated pulses, the converter of this invention is very insensitive to duty cycle variations of the input pulse width modulated control signal.

It is to be understood that the above described arrangements are but illustrative of the principles of the invention. Numerous other arrangements may be devised by those skilled in the art without departing from the spirit and scope of the invention. For example, the constant current generator, transistor 2, and its associated components, may be replaced with a resistance or a resistance and inductance connected in series between the positive charging source and capacitor 3. In cases where the linearity of the voltage charging ramp of capacitor 3 and consequently the conversion linearity would be overly impaired, a more positive charging source may be used. Another alternate arrangement, along the same line as above, could be made by using any constant current source or device compatible with the charging circuit of capacitor 3.

What is claimed is:

1. A signal receiver comprising:

a direct current voltage source;
electrical storage means;
means for charging said storage means;
means operative in response to an input signal for enabling said charging means to charge said storage means;
means coupled to said voltage source for establishing a predetermined direct current voltage at the input to said enabling means;
and means for detecting the peak of the charge in said storage means; characterized in that:
said enabling means is direct current coupled to said detecting means;
and in that upon failure to receive an input signal the voltage established at the input to said enabling means is coupled to the output of said detector to provide a predetermined output signal.

2. A signal receiver in accordance with claim 1, characterized in that said input signals are pulse width encoded and the output of the peak detecting means is filtered to provide an analog output signal.

3. A signal receiver in accordance with claim 1, characterized in that said enabling means and said peak detecting means each comprise an emitter follower circuit connected in cascade and composed of the same material to obviate variations due to temperature changes.

4. A pulse width to analog signal conversion circuit comprising:
a capacitor,
a voltage source,
means for charging said capacitor from said source,
means comprising a first transistor for enabling said charging means upon receipt of an input signal and for discharging said capacitor in the absence of said input signal,
means comprising a second transistor for providing an output signal corresponding to the peak level of charge on said capacitor, and
means for biasing said first transistor to permit said second transistor to maintain an output signal corresponding to a predetermined level of charge in the absence of an input signal.

5. A pulse width to analog signal conversion circuit in accordance with claim 4, wherein said first and second transistors are connected as emitter follower circuits in cascade and are composed of like materials to obviate errors introduced by temperature variations.

6. A pulse width to analog signal conversion circuit in accordance with claim 4 and further comprising:
capacitance means for coupling the pulse width input signal to said first transistor and filter means connected to said second transistor for producing the analog representation of said input signal and for applying the resultant output signal directly to the load.

References Cited

UNITED STATES PATENTS

| | | | |
|---|---|---|---|
| 3,277,311 | 10/1966 | Merlen et al. | 329—106 |
| 3,388,266 | 6/1968 | Kjar | 307—294 |

JOHN S. HEYMAN, Primary Examiner

B. P. DAVIS, Assistant Examiner

U.S. Cl. X.R.

307—235, 246; 328—120